(12) United States Patent
Welguisz et al.

(10) Patent No.: US 8,248,133 B2
(45) Date of Patent: Aug. 21, 2012

(54) PROGRAMMABLE DELAY TIMER AND METHOD THEREFOR

(75) Inventors: David M. Welguisz, Round Rock, TX (US); Michael S. Brady, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 180 days.

(21) Appl. No.: 12/767,492

(22) Filed: Apr. 26, 2010

(65) Prior Publication Data

US 2011/0260768 A1 Oct. 27, 2011

(51) Int. Cl.
*H03K 23/00* (2006.01)

(52) U.S. Cl. ........................................ 327/241
(58) Field of Classification Search .................. None
See application file for complete search history.

(56) References Cited

U.S. PATENT DOCUMENTS

| | | | |
|---|---|---|---|
| 4,330,751 A | 5/1982 | Swain | |
| 4,499,589 A | 2/1985 | Geesen | |
| 5,617,458 A | 4/1997 | Jones et al. | |
| 5,815,819 A * | 9/1998 | Ohta et al. | 455/574 |
| 6,018,258 A | 1/2000 | Kang | |
| 6,026,140 A | 2/2000 | Owen | |
| 6,489,817 B1 | 12/2002 | Wong et al. | |
| 6,566,918 B1 | 5/2003 | Nguyen | |
| 7,825,709 B2 * | 11/2010 | Lin et al. | 327/156 |
| 2007/0252620 A1 * | 11/2007 | Gailus et al. | 327/3 |

* cited by examiner

*Primary Examiner* — Lincoln Donovan
*Assistant Examiner* — Sibin Chen
(74) *Attorney, Agent, or Firm* — Daniel D. Hill; David G. Dolezal

(57) ABSTRACT

A timer circuit, comprises a delay indication circuit, a frequency indication circuit, and a plurality of counters. The delay indication circuit is for providing a delay time indication. The frequency indication circuit is for providing a frequency indication of a frequency of a clock signal. Each counter of the plurality of counters includes a load input to receive an initial value, and an indication output to provide a count complete indication of the counter. During operation a set of the counters of the plurality of counters is coupled in series to provide an indication that a delay time has expired. At least a portion of the frequency indication is provided to the load input of one counter of the set and at least a portion of the delay time indication is provided to the load input of another counter of the set.

20 Claims, 2 Drawing Sheets

PROGRAMMABLE DELAY TIMER AND METHOD THEREFOR

BACKGROUND

1. Field

This disclosure relates generally to timers, and more specifically, to a programmable delay timer and method therefor.

2. Related Art

Data processing systems are used in a variety of applications. In one application, a processor may be required to perform multiple tasks, where the tasks are separated by specific time periods. That is, the processor may have to wait a predetermined time period from the end of one task or event until the beginning of another task or event. Generally, the processor will include one or more registers for storing the time periods. The time periods may be stored as the number of clock edges needed to provide the delay time at a particular clock frequency. Also, the processor may be required to operate at several different clock frequencies. Typically, a system or software designer will manually determine the number of clock edges at a given clock frequency to load in the delay registers. If the clock frequency changes, the delay times stored in each of the delay registers will have to be recalculated. Manually calculating the delay register values takes time and can lead to errors.

Therefore, what is needed is a programmable delay timer that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
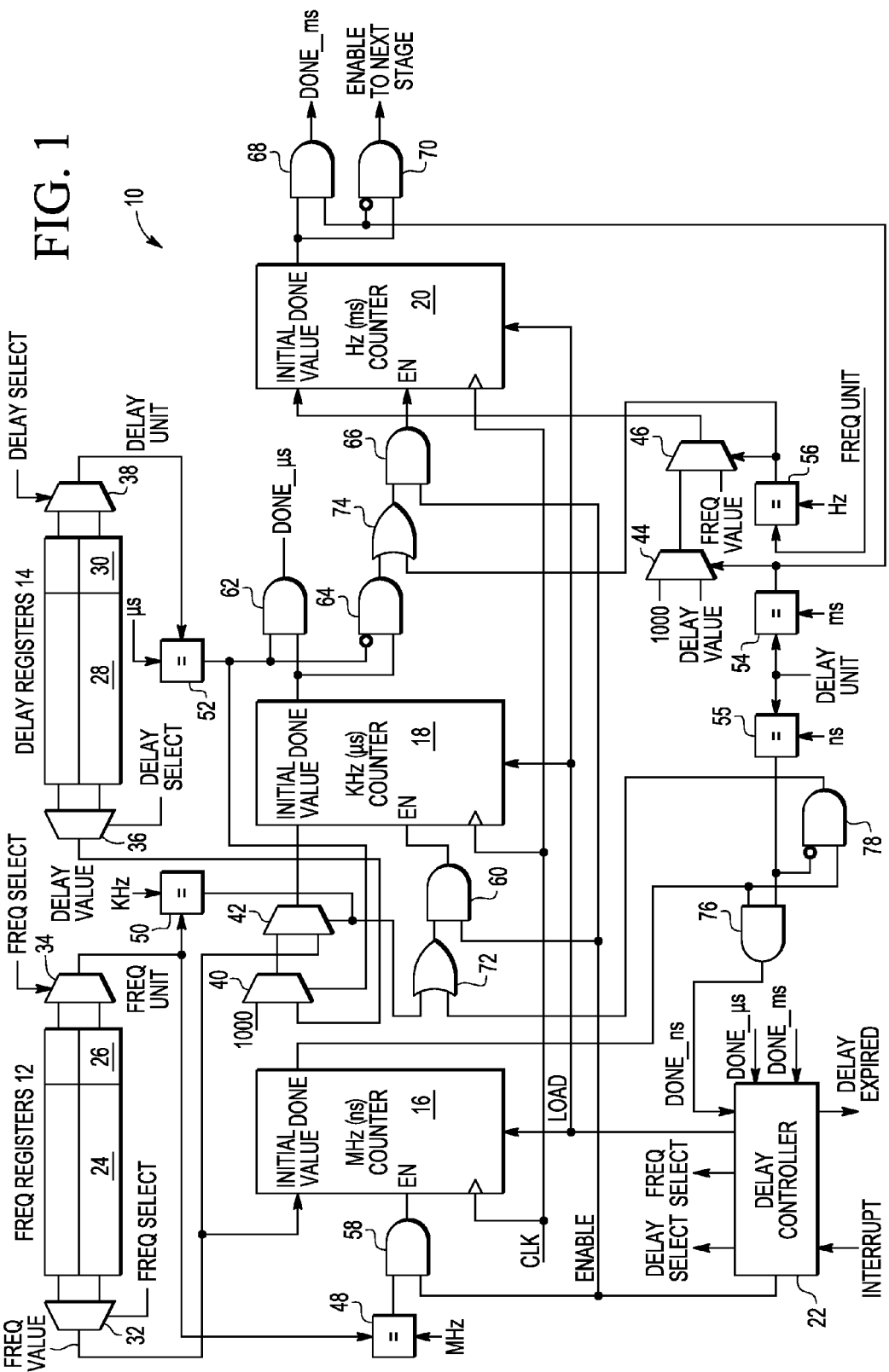
FIG. 1 illustrates, in partial block diagram form and partial logic diagram form, a programmable delay timer in accordance with an embodiment.

Generally, there is provided, a programmable delay timer having a frequency register for storing a clock frequency value, a delay register for storing the time period of a delay time, and a plurality of counters. The stored frequency value corresponds to the system clock frequency and the delay is the actual desired delay time for a processor to wait between tasks or events. The counters of the plurality of counters are connected together in series using combinational logic. The frequency register includes a frequency value portion and a units portion. The delay register includes a delay value portion and a units portion. The frequency and delay values are loaded into the counters and function as initial values from which to count. One or more of the plurality of counters is enabled in a sequence to count based on the values in the units portions of the frequency and delay registers. The enabled counters are decremented from the first enabled counter to the last enabled counter starting from the initial values. A delay expired signal is provided when the enabled counters finish decrementing to indicate lapse of the time period stored in the delay register.

The programmable delay timer allows a system or software designer to enter the current system clock frequency and the desired delay times that the system is to wait between events or tasks. The programmable delay timer eliminates the need for the designer to manually determine the number of clock edges necessary to provide the delay time period, thus reducing design time as well as possible errors in calculating the number of clock edges.

In one aspect there is provided a timer circuit, comprising: a delay indication circuit, the delay indication circuit providing a delay time indication; a frequency indication circuit, the frequency indication circuit providing a frequency indication of a frequency of a clock signal; a clock input to receive the clock signal; and a plurality of counters, wherein each counter of the plurality of counters includes a load input to receive an initial value and an indication output to provide a count complete indication of the counter, wherein during operation when a set of the counters of the plurality of counters is coupled in series to provide an indication that a delay time has expired, at least a portion of the frequency indication is provided to the load input of one counter of the set and at least a portion of the delay time indication is provided to the load input of another counter of the set. The frequency indication may include a first portion and a second portion, wherein the first portion of the frequency indication is selectably providable to a load input of a counter of the plurality of counters based on the second portion of the frequency indication. The first portion of the frequency indication may be selectably providable to a load input of a second counter of the plurality of counters based on the second portion of the frequency indication. The plurality of counters may be couplable in series; and for an initial in-series counter of the plurality of counters, the load input is coupled to the frequency indication circuit to receive the first portion of the frequency indication. Each subsequent counter of the plurality of counters couplable in the series may include an input to selectably receive, based on a portion of the frequency indication, a count complete indication from the indication output of a preceding counter of the plurality of counters couplable in the series. When a set of the counters of the plurality of counters is coupled in series to provide an indication that a delay time has expired, a first portion of the delay indication may be provided to the load input of the another counter. The another counter may be selected from the plurality of counters based upon a second portion of the delay time indication. The first portion of the delay time indication may indicate a numerical value of a delay time and the second portion of the delay time indication indicates a unit of time of the delay time. When a set of the counters of the plurality of counters is coupled in series to provide an indication that a delay time has expired, the indication output of the another counter may provide an indication that a delay time has expired. Each counter of the plurality of counters may include a clock input for receiving the clock signal. When a set of the counters of the plurality of counters is coupled in series to provide an indication that a delay time has expired, at least the one counter may receive the clock signal at a clock input of the counter. When a set of the counters of the plurality of counters is coupled in series to provide an indication that a delay time has expired, a first portion of the frequency indication may be provided to the load input of the one counter; and the one counter may be selected from the plurality of counters based upon a second portion of the frequency indication. The first portion of the frequency indication may indicate a numerical value of the frequency of the clock signal and the second portion of the frequency indication indicates a frequency unit of the clock signal.

In another aspect, there is provided, a method comprising: providing a delay time indication to a counter circuit, the delay time indication indicating a desired delay time to be indicated by the counter circuit; providing a frequency indication to the counter circuit; providing a clock signal to the counter circuit, the frequency indication indicating the frequency of the clock signal; running a set of a plurality of counters of the counter circuit coupled in series and using an output of the set to provide an indication of an expired delay time, wherein each counter of the set includes an indication output to provide a count complete indication of the counter, wherein during the running, the indication output of each preceding counter of the set is coupled to an input of a subsequent counter of the set, wherein prior to the running, at least a portion of the frequency indication is loaded into one counter of the set and at least a portion of the delay time indication is loaded into another counter of the set. The delay time indication may include a first portion and a second portion, wherein the first portion is loaded into the another counter; wherein the second portion is used to select the another counter from a plurality of counters of the counter circuit. The using the output of the set to provide an indication of an expired delay time may include using the indication output of the another counter to provide the indication of the expired delay time. The one counter of the set may be the initial in series counter of the set. The frequency indication may include a first portion and a second portion, wherein the first portion is loaded into the one counter; wherein the second portion may be used to select the one counter from a plurality of counters of the counter circuit. The set may include an intermediate counter coupled between the one counter and the another counter in the series, wherein the indication output of the intermediate counter may be coupled to an input of the another counter in the set, wherein prior to the running, a predetermined value is loaded into the intermediate counter.

In yet another aspect, there is provided, a method comprising: providing a delay time indication to a counter circuit including a plurality of counters, the delay time indication including a first portion and a second portion, the delay time indication indicating a desired delay time to be indicated by the counter circuit, wherein each counter of the plurality of counters includes an indication output to provide a count complete indication of the counter; providing a frequency indication to the counter circuit; providing a clock signal to the counter circuit, the frequency indication indicating the frequency of the clock signal; coupling a set of the plurality of counters in series, wherein the indication output of each preceding counter of the set is coupled to an input of a subsequent counter of the set, wherein the coupling includes selecting a selected counter of the plurality of counters based on the second portion of the delay time indication, the set including the selected counter, wherein the coupling includes selecting an initial in series counter for the set from the plurality of counters; loading the initial in series counter with at least a portion of the frequency indication; loading the selected counter with the first portion of the delay time indication; and after the loading the initial in series counter and the selected counter, running the counters of the set and using the indication output of the selected counter to provide an indication of an expired delay time. The step of loading the initial in series counter may include loading the initial in series counter with a first portion of the frequency indication; and the step of selecting the initial in series counter for the set from the plurality of counters may include selecting based on a second portion of the frequency indication.

The terms "assert" (or "set") and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in partial block diagram form and partial logic diagram form, programmable delay timer 10 in accordance with an embodiment. Programmable delay timer 10 may be implemented as part of a data processing system on one or more integrated circuits. Programmable delay timer includes frequency registers 12, delay registers 14, counters 16, 18, and 20, delay controller 22, multiplexers 32, 34, 36, 38, 40, 42, 44, and 46, comparators 48, 50, 52, 54, 55, and 56, AND logic gates 58, 60, 62, 64, 66, 68, 70, 76, and 78, and OR logic gates 72 and 74. In the illustrated embodiment, frequency registers 12 includes two registers for storing a multi-bit value corresponding to a clock frequency. Each register includes a bit field 24 for storing a frequency value and a bit field 26 for storing the units of the frequency value. For example, the units may be megahertz (MHz), kilohertz (kHz), or Hertz (Hz), or the like. In another embodiment, there may be more than two frequency registers or only one. Likewise, the delay registers 14 includes two registers for storing a multi-bit value corresponding to the delay time period. The delay registers 14 each include a bit field 28 for storing a numerical delay time period and a bit field 30 for storing the units of the delay time. For example, units of delay time may be micro-seconds (μs), milli-seconds (ms), or nano-seconds (ns), or the like. In another embodiment, there may be only one delay register or more than two delay registers.

As can be seen, counters 16, 18, and 20 are generally coupled in series via combinational logic. In another embodiment, there may be more than three counters. As illustrated in FIG. 1, counter 18 is an intermediate counter. In another embodiment, there may be more than one intermediate counters. In one embodiment, counters 16, 18, and 20 are 10-bit counters. Counters 16, 18, and 20 each include an input labeled "INITIAL VALUE" for receiving either a portion of registers 12 or 14 or "1000", an enable input labeled "EN", a clock input for receiving a clock signal labeled "CLK", an input for receiving a load signal labeled "LOAD", and a count complete signal labeled DONE. Delay controller 22 includes an input for receiving an interrupt labeled "INTERRUPT", inputs for receiving count completion signals labeled "DONE_μs", "DONE_ms", and "DONE_ns", outputs for providing signals labeled "DELAY SELECT" "FREQ SELECT", "LOAD", and an output labeled "DELAY EXPIRED" to indicate that the delay time has expired. In one embodiment, delay controller 22 is implemented as a state machine. The counters may have additional inputs and outputs that are not illustrated, such as for example, a reset input. Depending on the clock frequency and the delay time, a set of the counters will be loaded with a frequency value and a delay time. For example, counter 16 is used when the clock frequency is in the mega-Hertz range or the delay value is in nano-seconds (ns). However, the illustrated embodiment does not support delay values in the nano-second range without adding a comparator and additional combinational logic as will become clear from the discussion below. Counter 18 is used when the clock frequency is in the kilo-Hertz range or the delay voltage is in the micro-second range. Counter 20 is used when the clock frequency is in the Hz range or the delay is in the milli-second range. However, the illustrated embodiment does not support a clock frequency in the Hertz range without adding another counter and combinational logic to the output of AND logic gate 70. In the interest of clarity and brevity, the description will be limited to only a few frequency and delay time ranges.

Figure 2:
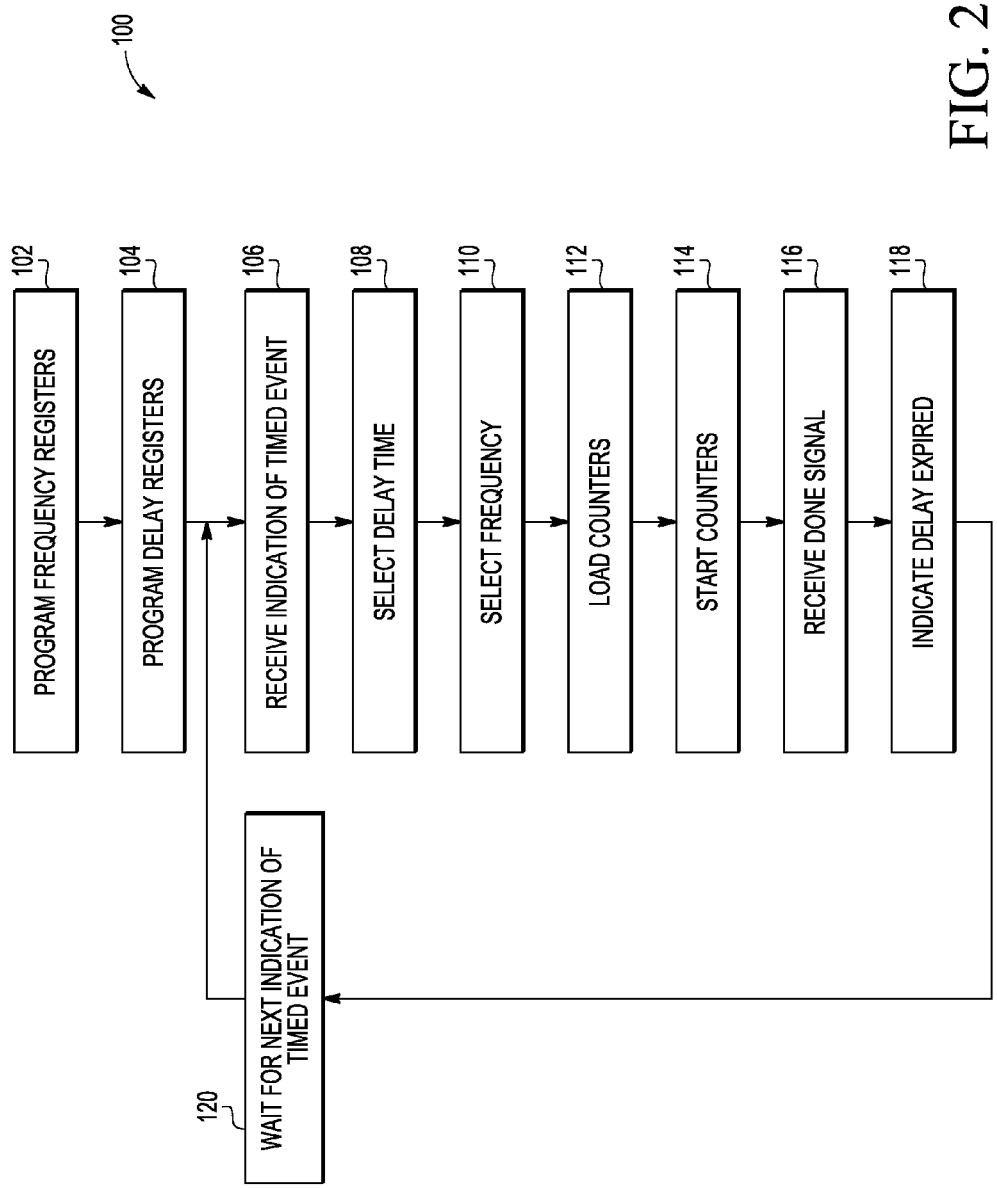
FIG. 2 illustrates a flow chart for a method for providing a delay using the programmable delay timer of FIG. 1.

FIG. 2 illustrates a flow chart for a method 100 for providing a delay using the programmable delay timer of FIG. 1.

The operation will be described with references to both FIG. 1 and FIG. 2. In operation, one of the registers of registers 12 is programmed with the clock frequency as provided in step 102. The clock frequency is the same as the system clock frequency of clock CLK. In an embodiment capable of running at multiple frequencies, a register may be provided that corresponds to each of the multiple frequencies. The registers 14 are programmed with the desired delay times as provided in step 104. When a delay time is to be inserted into the execution of a program or system operation, a start signal is asserted by a processor (not shown) in response to a timed event (step 106 of FIG. 2). In the illustrated embodiment, the start signal is in the form of an interrupt (INTERRUPT) provided to delay controller 22. In another embodiment, the start signal may take another form, such as for example, a done signal from one of counters 16, 18, and 20 may function to start an additional delay period. Also, the frequency and delay values may be provided by another type of delay or clock frequency indication circuit instead of registers.

In response to the interrupt, delay controller 22 will provide signals DELAY SELECT and FREQ SELECT to multiplexers 36, 38, 34, and 32, respectively, to select one of registers 14 and one of registers 12 as indicated in steps 108 and 110. The contents of register bit field 24 will be used as the initial count value for one of counters 16 and 18. The contents of register bit field 28 will be used as the initial count value for one of counter 18 and counter 20. The load signal LOAD will be asserted as a logic high as indicated in step 112. Enable signal ENABLE will be asserted as a logic high by controller 22 in response to the interrupt. Comparators 48, 50, 52, 54, 55, and 56 compare the register values with a preprogrammed units value to determine which of counters 16, 18, and 20 will be loaded with the frequency values and the delay values. For example, comparator 48 will cause counter 16 to be loaded with the stored clock frequency in registers 12 if the stored clock frequency is in the mega-Hertz range, as indicated by a favorable comparison between the frequency units (FREQ UNIT) stored in bit field 26, as the identity for a frequency in mega-Hertz (MHz). Otherwise, counter 16 is not used in the illustrated embodiment. Comparator 50 will cause counter 18 to be loaded with the stored frequency from registers 12 if the frequency units (FREQ UNIT) is in the kilo-Hertz range. If the frequency is in the mega-Hertz range and the delay is in the micro-second range, comparator 52 will cause counter 18 to be loaded with a delay time. Counter 20 is used to count from a delay time in the milli-second range if the delay unit bit field 30 compares favorably with the ms input of comparator 54. Comparator 56 is not used unless an additional counter is coupled to the output of AND logic gate 70. Because the illustrated embodiment of timer 10 is intended to be a simple timer, there are some limitations regarding certain combinations of clock frequency and delay. Generally, the delay value cannot be loaded into counter 16 and the frequency cannot be loaded into counter 20. Also, as illustrated, timer 10 cannot provide a nano-second delay if the frequency is in the mega-Hertz range. In addition, timer 10 cannot provide a micro-second delay if the frequency is in the kilo-Hertz frequency range. Additional delay and frequency combinations can be provided by increasing the combinational logic and number of counters as will become apparent.

Generally, if counter 16 is loaded with an initial value from registers 12, intermediate counter 18 will be loaded with "1000" if the delay time is not in the micro-second range, and counter 20 will be loaded with the delay time from registers 14. If counter 18 is loaded with the initial value from registers 12, because the frequency is in the kilo-Hertz range, counter 16 is not used and counter 20 is loaded with the delay value.

By way of example, assume register 12 includes a clock frequency in the mega-Hertz range and register 14 indicates a delay time in the milli-second range. The FREQ UNIT of bit field 26 is provided as an input to comparators 48 and 50 via multiplexer 34. The frequency value (FREQ VALUE) is loaded into counter 16 in response to a load signal LOAD from controller 22. Multiplexer 32 is used to select which register of registers 12 will be loaded in response to select signal FREQ SELECT. When the contents of bit field 26 indicate the clock frequency is in the mega-Hertz range, comparator 48 will detect a match between the FREQ UNIT and the MHz input. At the same time, comparator 50 will compare the FREQ UNIT to a value kHz corresponding to the predetermined value for a frequency in the kilo-Hertz range. When the FREQ UNIT is equal to the MHz value, a logic high value will be provided by comparator 48 to an input of AND logic gate 58. The delay units of a selected one of bit field 30 are compared by comparators 52, 54, and 55. If the delay is not in the micro-second range, as in the described example, comparator 52, will cause the number "1000" to be loaded into counter 18 via multiplexers 40 and 42 when the frequency is in the mega-Hertz range. If the delay is in the micro-second range, comparator 52 will cause the initial value of counter 18 to be the DELAY VALUE from one of bit fields 28 of registers 14. In the present example, a match signal will be provided by comparator 54 indicating that the desired delay is in the milli-second range. The value "1000" will be loaded into counter 18 because the value of DELAY UNIT is not in the micro-second range and FREQ UNIT is not in the kilo-Hertz range. If the FREQ VALUE is in the kHz range, as indicated by the FREQ UNIT, then the FREQ VALUE will be loaded into counter 18, and the delay value DELAY VALUE will be loaded into counter 20. Delay controller 22 will assert LOAD to counters 16, 18, and 20 to latch the initial value into an internal register as indicated at step 112 of FIG. 2. Continuing with the above example, counter 16 is loaded with the frequency FREQ VALUE and counter 16 is decremented in response to clock signal CLK from the initial value to zero when the ENABLE signal is asserted as indicated at step 114 of FIG. 2. Note that even though a decrementing counter is used in the illustrated embodiment, in another embodiment, an incrementing counter may be used. When counter 16 is finished counting, a DONE signal is asserted by counter 16 to an input of AND gate 78 and counter 18 will begin counting from the preloaded value of "1000". When the count of counter 18 reaches zero, a DONE signal is asserted to AND logic gate 64 and because the delay is not in the micro-second range, AND gate 64 will provide a logic high to OR gate 74. OR gate 74 will then provide a logic high to an input of AND logic gate 66. In response to the enable signal ENABLE, AND logic gate 66 will enable counter 20 to begin counting down from the DELAY VALUE. A DONE_ms signal is provided to controller 22 to indicate the end of a delay time in the milli-second range. When signal DONE is asserted as shown in step 116, the initial value is latched into the counter and the counter will count down to zero again when the ENABLE signal is asserted. Controller 22 will de-assert the ENABLE signal to counters 16, 18, and 20 to prevent this extra counting. Controller 22 will assert the DELAY EXPIRED, signal to the processor (not shown) and thus the end of the programmed time period as shown in step 118. As described above, additional stages including additional counters and logic may be included to provide longer delay times, for example, delays in the seconds range. Comparator 56 would be used if the FREQ VALUE is in the Hertz range when additional downstream counters are provided. Also, note that in different embodiments different combinational logic may be used instead of the illustrated logic gates.

When the delay time has expired as indicated at step 118, timer 10 will wait for the next indication of a timed event or task as shown at step 120. When the next timed event indication is received, the flow continues at step 106. In one embodiment, the controller can preload the next delay time and frequency from registers 14 and 12 into the counters and so be prepared for the next timed event.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of programmable delay timer 10 are circuitry located on a single integrated circuit or within a same device. Alternatively, programmable delay timer 10 may include any number of separate integrated circuits or separate devices interconnected with each other. Also for example, programmable delay timer 10 or portions thereof may be soft or code representations of physical circuitry or of logical representations convertible into physical circuitry. As such, programmable delay timer 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A timer circuit, comprising:
    a delay indication circuit, the delay indication circuit providing a delay time indication;
    a frequency indication circuit, the frequency indication circuit providing a frequency indication of a frequency of a clock signal;
    a clock input to receive the clock signal; and
    a plurality of counters, wherein each counter of the plurality of counters includes a load input to receive an initial value and an indication output to provide a count complete indication of the counter, wherein during operation when a set of the counters of the plurality of counters is coupled in series to provide an indication that a delay time has expired, at least a portion of the frequency indication is provided to the load input of one counter of the set and at least a portion of the delay time indication is provided to the load input of another counter of the set.

2. The timer circuit of claim 1 wherein the frequency indication includes a first portion and a second portion, wherein the first portion of the frequency indication is selectably providable to a load input of a counter of the plurality of counters based on the second portion of the frequency indication.

3. The timer circuit of claim 2 wherein the first portion of the frequency indication is selectably providable to a load input of a second counter of the plurality of counters based on the second portion of the frequency indication.

4. The timer circuit of claim 2 wherein:
    the plurality of counters is couplable in series; and
    for an initial in series counter of the plurality of counters, the load input is coupled to the frequency indication circuit to receive the first portion of the frequency indication.

5. The timer circuit of claim 1 wherein:
    the plurality of counters is couplable in series; and
    each subsequent counter of the plurality of counters couplable in the series includes an input to selectably receive, based on a portion of the frequency indication, a count complete indication from the indication output of a preceding counter of the plurality of counters couplable in the series.

6. The timer circuit of claim 1 wherein:
when a set of the counters of the plurality of counters is coupled in series to provide an indication that a delay time has expired, a first portion of the delay indication is provided to the load input of the another counter; and
the another counter is selected from the plurality of counters based upon a second portion of the delay time indication.

7. The timer circuit of claim 6 wherein the first portion of the delay time indication indicates a numerical value of a delay time and the second portion of the delay time indication indicates a unit of time of the delay time.

8. The timer circuit of claim 1 wherein when a set of the counters of the plurality of counters is coupled in series to provide an indication that a delay time has expired, the indication output of the another counter provides an indication that a delay time has expired.

9. The timer circuit of claim 1 wherein when a set of the counters of the plurality of counters is coupled in series to provide an indication that a delay time has expired, at least the one counter receives the clock signal at a clock input of the counter.

10. The timer circuit of claim 1 wherein:
when a set of the counters of the plurality of counters is coupled in series to provide an indication that a delay time has expired, a first portion of the frequency indication is provided to the load input of the one counter; and
the one counter is selected from the plurality of counters based upon a second portion of the frequency indication.

11. The timer circuit of claim 10 wherein the first portion of the frequency indication indicates a numerical value of the frequency of the clock signal and the second portion of the frequency indication indicates a frequency unit of the clock signal.

12. A timer circuit, comprising:
a delay indication circuit, the delay indication circuit providing a delay time indication;
a frequency indication circuit, the frequency indication circuit providing a frequency indication of a frequency of a clock signal;
a clock input to receive the clock signal; and
a plurality of counters, wherein each counter of the plurality of counters includes a load input to receive an initial value and an indication output to provide a count complete indication of the counter, wherein during operation when a set of the counters of the plurality of counters is coupled in series to provide an indication that a delay time has expired, at least a portion of the frequency indication is provided to the load input of one counter of the set and at least a portion of the delay time indication is provided to the load input of another counter of the set, and wherein each counter of the plurality of counters includes a clock input for receiving the clock signal.

13. A method comprising:
providing a delay time indication to a counter circuit, the delay time indication indicating a desired delay time to be indicated by the counter circuit;
providing a frequency indication to the counter circuit;
providing a clock signal to the counter circuit, the frequency indication indicating the frequency of the clock signal; and
running a set of a plurality of counters of the counter circuit coupled in series and using an output of the set to provide an indication of an expired delay time, wherein each counter of the set includes an indication output to provide a count complete indication of the counter, wherein during the running, the indication output of each preceding counter of the set is coupled to an input of a subsequent counter of the set, wherein prior to the running, at least a portion of the frequency indication is loaded into one counter of the set and at least a portion of the delay time indication is loaded into another counter of the set.

14. The method of claim 13 further wherein:
the delay time indication includes a first portion and a second portion, wherein the first portion is loaded into the another counter;
wherein the second portion is used to select the another counter from a plurality of counters of the counter circuit.

15. The method of claim 13 wherein the using the output of the set to provide an indication of an expired delay time includes using the indication output of the another counter to provide the indication of the expired delay time.

16. The method of claim 13 further wherein:
the one counter of the set is the initial in series counter of the set.

17. The method of claim 16 wherein:
the frequency indication includes a first portion and a second portion, wherein the first portion is loaded into the one counter;
wherein the second portion is used to select the one counter from a plurality of counters of the counter circuit.

18. The method of claim 13 wherein the set includes an intermediate counter coupled between the one counter and the another counter in the series, wherein the indication output of the intermediate counter is coupled to an input of the another counter in the set, wherein prior to the running, a predetermined value is loaded into the intermediate counter.

19. A method comprising:
providing a delay time indication to a counter circuit including a plurality of counters, the delay time indication including a first portion and a second portion, the delay time indication indicating a desired delay time to be indicated by the counter circuit, wherein each counter of the plurality of counters includes an indication output to provide a count complete indication of the counter;
providing a frequency indication to the counter circuit;
providing a clock signal to the counter circuit, the frequency indication indicating the frequency of the clock signal;
coupling a set of the plurality of counters in series, wherein the indication output of each preceding counter of the set is coupled to an input of a subsequent counter of the set, wherein the coupling includes selecting a selected counter of the plurality of counters based on the second portion of the delay time indication, the set including the selected counter, wherein the coupling includes selecting an initial in series counter for the set from the plurality of counters;
loading the initial in series counter with at least a portion of the frequency indication;
loading the selected counter with the first portion of the delay time indication; and
after the loading the initial in series counter and the selected counter, running the counters of the set and using the indication output of the selected counter to provide an indication of an expired delay time.

20. The method of claim 19 wherein:
the loading the initial in series counter includes loading the initial in series counter with a first portion of the frequency indication; and
the selecting the initial in series counter for the set from the plurality of counters includes selecting based on a second portion of the frequency indication.

* * * * *